(12) United States Patent
Apelsmeier et al.

(10) Patent No.: US 11,195,778 B2
(45) Date of Patent: Dec. 7, 2021

(54) ELECTRONIC POWER MODULE

(71) Applicants: AUDI AG, Ingolstadt (DE); ABB Schweiz AG, Baden (CH)

(72) Inventors: Andreas Apelsmeier, Pollenfeld (DE); Günter Vetter, Burladingen (DE)

(73) Assignees: AUDI AG, Ingolstadt (DE); ABB Schweiz AG, Baden (CH)

(*) Notice: Subject to any disclaimer, the term of this patent is extended or adjusted under 35 U.S.C. 154(b) by 164 days.

(21) Appl. No.: 15/781,326

(22) PCT Filed: Nov. 24, 2016

(86) PCT No.: PCT/EP2016/078680
§ 371 (c)(1),
(2) Date: Jun. 4, 2018

(87) PCT Pub. No.: WO2017/093116
PCT Pub. Date: Jun. 8, 2017

(65) Prior Publication Data
US 2018/0358282 A1    Dec. 13, 2018

(30) Foreign Application Priority Data

Dec. 4, 2015    (DE) .................... 10 2015 015 699.3

(51) Int. Cl.
*H01L 23/373*    (2006.01)
*H01L 21/48*    (2006.01)
(Continued)

(52) U.S. Cl.
CPC ...... *H01L 23/3738* (2013.01); *H01L 21/4803* (2013.01); *H01L 21/4814* (2013.01);
(Continued)

(58) Field of Classification Search
CPC ............ H01L 23/3738; H01L 21/4803; H01L 21/4814; H01L 23/367; H01L 24/36;
(Continued)

(56) References Cited

U.S. PATENT DOCUMENTS 4,881,237 A * 11/1989 Donnelly .............. H01S 5/0233
372/50.12
5,948,689 A * 9/1999 Hamburgen .......... H01L 23/367
257/722
(Continued)

FOREIGN PATENT DOCUMENTS

DE    29 45 385 A1    5/1980
DE    199 32 442 A1    9/2000
(Continued)

OTHER PUBLICATIONS

Office Action dated Dec. 14, 2018 in corresponding German Application No. 10 2015 015 699.3; 15 pages including partial machine-generated English-language translation.
(Continued)

*Primary Examiner* — Benjamin Tzu-Hung Liu
(74) *Attorney, Agent, or Firm* — Maier & Maier, PLLC

(57) ABSTRACT

An electronic power module, including at least one semiconductor component, which is arranged on a support, as well as a cooling element, which is in thermal contact with the semiconductor component, wherein the support includes a semiconductor material and, at the same time, serves as a cooling element.

7 Claims, 2 Drawing Sheets

(51) Int. Cl.
*H01L 23/367* (2006.01)
*H01L 23/00* (2006.01)
*H01L 23/14* (2006.01)

(52) U.S. Cl.
CPC .......... *H01L 23/147* (2013.01); *H01L 23/367* (2013.01); *H01L 24/36* (2013.01); *H01L 2224/40095* (2013.01); *H01L 2224/40137* (2013.01); *H01L 2224/40139* (2013.01); *H01L 2924/13055* (2013.01)

(58) Field of Classification Search
CPC .......... H01L 23/147; H01L 2924/13055; H01L 2224/40137; H01L 2224/40139; H01L 2224/40095; H01L 2224/37139; H01L 24/37; H01L 2224/37147; H01L 24/40; H01L 24/84; H01L 2224/84801; H01L 2224/8484

See application file for complete search history.

(56) References Cited

U.S. PATENT DOCUMENTS

| | | | |
|---|---|---|---|
| 2002/0053720 A1 | 5/2002 | Boursat et al. | |
| 2007/0194383 A1* | 8/2007 | Kato | H01L 21/84 257/365 |
| 2008/0237656 A1* | 10/2008 | Williams | H01L 29/735 257/262 |
| 2013/0119404 A1 | 5/2013 | Saunier, III et al. | |
| 2014/0290926 A1 | 10/2014 | Kim et al. | |
| 2015/0098191 A1 | 4/2015 | Kim | |
| 2015/0260766 A1* | 9/2015 | Bode | G01R 31/002 324/126 |
| 2015/0311137 A1 | 10/2015 | Oganesian | |
| 2016/0334362 A1* | 11/2016 | Liu | H01L 23/345 |

FOREIGN PATENT DOCUMENTS

| | | |
|---|---|---|
| DE | 10 2004 019 445 A1 | 11/2005 |
| DE | 10 2004 022 118 A1 | 11/2005 |
| DE | 10 2012 213 066 B3 | 9/2013 |
| EP | 1 189 277 A1 | 3/2002 |
| EP | 2 355 143 A1 | 8/2011 |

OTHER PUBLICATIONS

Translation of International Preliminary Report on Patentability dated Jun. 7, 2018 of corresponding International application No. PCT/EP2016/078680; 5 pgs.
Examination Report dated Aug. 8, 2016 of corresponding German application No. 10 2015 015 699.3; 6 pgs.
International Search Report and Written Opinion of the International Search Authority dated Feb. 2, 2017 of corresponding International application No. PCT/EP2016/078680; 14 pgs.
International Preliminary Report on Patentability dated Jan. 23, 2018 of corresponding International application No. PCT/EP2016/078680; 12 pgs.
Chinese Office Action dated Aug. 3, 2020, in connection with corresponding CN Application No. 201680070510.3 (11 pgs., including machine-generated English translation).
German Office Action dated May 25, 2020, in connection with corresponding DE Application No. 10 2015 015 699.3 (11 pgs., including machine-generated English translation).
German Office Action dated Jun. 21, 2021, in connection with corresponding DE Application No. 10 2015 015 699.3 (8 pp., including machine-generated English translation).
Chinese Office Action dated May 27, 2021, in connection with corresponding CN Application No. 201680070510.3 (13 pp., including machine-generated English translation).

* cited by examiner

ELECTRONIC POWER MODULE

FIELD

The invention relates to an electronic power module, comprising at least one semiconductor component, which is arranged on a support, as well as a cooling element, which is in thermal contact with the semiconductor component.

BACKGROUND

Such electronic power modules are employed in different fields of application. An example is application in the motor vehicle, where, for example, in the field of steering control or transmission control, they are used during operation via the onboard power supply, which is usually designed to be 12 V. Further applications are afforded in hybrid vehicles or plug-in hybrid vehicles, where such semiconductor power modules are employed, for example, in traction pulse inverters or in DC/DC converters.

Such a power module is relatively complex in terms of its manufacture and its construction. In a first step, a support, a so-called DCB substrate (DCB=direct copper bonded) is produced. For this purpose, generally a ceramic substrate, usually $Al_2O_3$ ceramic, is coated with copper on both sides via a bonding process, so that large-area copper layers are obtained on both sides. In a next step, a corresponding circuit layout has to be structured on one side on which the electronic component or components is/are to be arranged, usually in a masking process and subsequent etching process. The semiconductor component or components, usually in chip form, is/are attached thereupon and contacted on the structured copper layer, that is, the metal layer, by way of a sintering or soldering process. In a further process step, the component or components is/are thereupon contacted on their top side with one another or with the metal layer by soldering, bonding, or sintering. Finally, in a last step, the structure produced in this way is attached to a cooling element, which, for example, is manufactured from copper, AlSiCu, or the equivalent, on the opposite-lying copper layer by way of a large-area soldering process. The manufacturing process thus necessitates a large number of different steps and, in particular, the complicated production and handling of the DCB substrate.

The invention is accordingly based on the object of presenting a power module that, in contrast, is simple in terms of construction.

SUMMARY

In order to achieve this object, it is provided that, for an electronic power module of the kind mentioned in the introduction, the support is composed of a semiconductor material and, at the same time, serves as a cooling element.

For the power module according to the invention, the support serves a double function. On the one hand, it serves as a substrate, on which the semiconductor component or components is/are arranged; on the other hand, it serves, at the same time, as a cooling element. Therefore, only one component, which serves for component mounting as well as cooling, is employed, in contrast to the prior art, where, as described, it is necessary to produce a DCB substrate in a complicated way as a support part for component mounting as well as a separate, additional cooling element. Because the semiconductor component or components is/are structured directly on the semiconductor support, additional advantages ensue in terms of the service life of the power module, because fewer different materials are present inside the total structure, so that markedly reduced thermomechanical stresses occur during operation. As described, in the prior art, the DCB substrate, which is composed of the ceramic support as well as the copper layers on both sides, is provided, said copper layers having, in turn, different expansion coefficients in comparison to the contacting means used, such as the solder, etc. as well as relative to the cooling element, in particular. Accordingly, based on the elimination of the DCB substrate, fewer levels or layers with different thermal expansion coefficients result, and the thermal expansion coefficients can also be better matched to one another. It is also possible to optimize the thermal resistance of the total structure, because, as described, fewer layers made of different materials are employed.

Used as a semiconductor material making up the support is preferably silicon, which is used extensively in semiconductor technology and has long been processed in process engineering without any problem. However, other semiconductor materials, such as, for example, GaN or GaAs, can also be used as a semiconductor material.

In accordance with a first alternative of the invention, at least one insulating layer can be deposited on the support, on which is applied at least one conductive metal layer, with which the at least one semiconductor component is contacted. The support is therefore furnished with an insulating layer in order to separate it electrically from the semiconductor component or components. Subsequently, a conductive metal layer is applied onto the insulating layer and structured, serving for the contacting of the semiconductor component or components.

Especially preferred, an oxide layer is used as an insulating layer, which is produced directly on the cooling element made of the semiconductor material. Because silicon is preferably used, what is involved in the case of the oxide layer is appropriately a $SiO_2$ layer, the production of which is a common process in semiconductor technology. By way of said insulating layer, in particular for applications in the high-voltage area when voltages of several hundred volts are therefore applied, it is possible to achieve the insulation of the support opposite the active semiconductor component.

Obviously, it is possible to arrange a plurality of semiconductor components on the metal layer, which, as described, is correspondingly structured, and to contact them with said metal layer or to contact them with one another, so that the power module ultimately can be configured in any desired way.

Alternatively to the application of an insulating layer and a metal layer, it is conceivable to create on the support itself, by corresponding doping, a conductive structure, with which the at least one electronic component is contacted. In this alternative of the invention, the conductive structure is therefore produced in the support itself by incorporating appropriate doping elements; this means that the support is equipped locally to be adequately conductive. In this case, the semiconductor component or components is/are placed directly on the support, without the intervention of an insulating layer or metal layer, and correspondingly contacted with the conductive structure. Here, too, there exists the possibility of contacting a plurality of semiconductor components with the conductive structure.

For connection of the semiconductor component or components to the metal layer or to the support itself, a sintering or welding process using corresponding sintering or welding material is employed. The contacting of the semiconductor component or components on the top side of the components can be produced by soldering, bonding, or sintering.

As a semiconductor component, it is possible to use virtually any semiconductor component that is needed or required for structuring a power module, such as, for example, an IGBT or a diode bare die, this listing not being conclusive.

As described, at the same time, the support serves also as a cooling element. In order to enable a dissipation of heat that is as efficient as possible, the cooling element in accordance with an enhancement of the invention is structured on the back side to form a cooling structure. The cooling structure is preferably produced in the form of crosspieces or ribs, so that, by way of said structuring, a markedly larger surface can be produced, via which the dissipation of heat occurs.

A notable further advantage of the invention additionally consists in the fact that, in consequence of the use of a support made of a semiconductor material, it is possible to create in the support itself, through doping, at least one additional electronic component and therefore to integrate said electronic component directly in the support. This means that, through the incorporation of corresponding doping elements, it is possible to create corresponding components, such as current or temperature sensors, diodes, and the like. In this case, the support therefore serves yet a third function in addition to the mounting of the semiconductor components and the cooling, namely, as a substrate for the integrated formation of one electronic component or of a plurality of additional electronic components.

BRIEF DESCRIPTION OF THE DRAWINGS

Further advantages and details of the invention ensue from the exemplary embodiments described below as well as on the basis of the drawing. Shown herein are.

DETAILED DESCRIPTION

Figure 1:
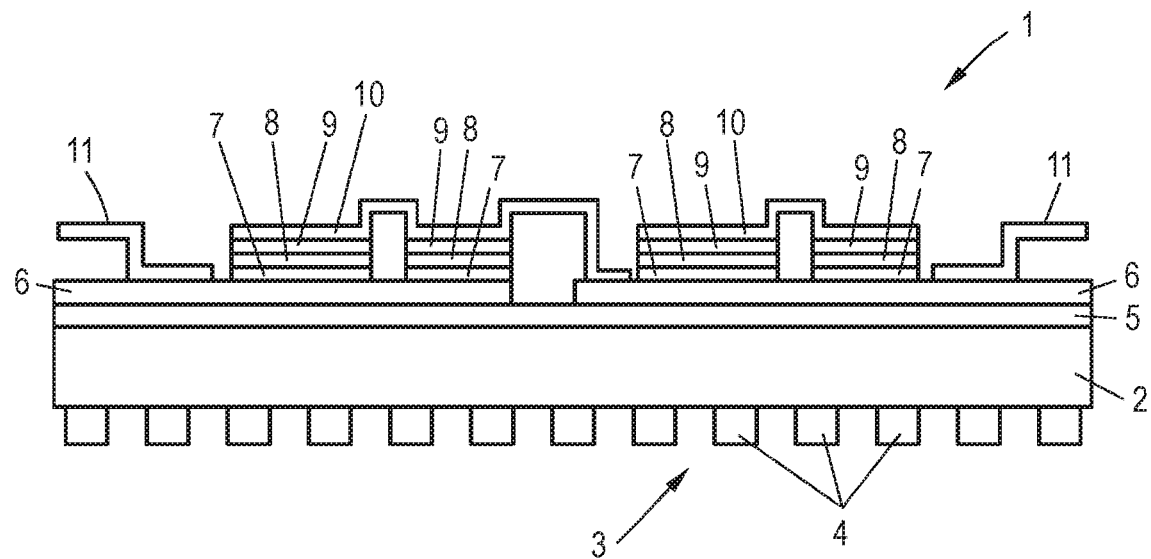
FIG. 1 a schematic illustration of an electronic power module of a first embodiment, FIG. 2 a schematic illustration of an electronic power module of a second embodiment, and FIG. 3 a schematic illustration of an electronic power module of a third embodiment.

FIG. 1 shows an electronic power module 1, comprising a support 2 made of a semiconductor material, such as, for example, silicon. Said support 2 serves as a substrate for mounting components and, at the same time, as a cooling element. It is furnished on its bottom side with a surface structuring 3, which, here, is in the form of projecting ribs or crosspieces 4.

Applied on the support 2, which is multifunctional because it also serves as a cooling element, is an insulating layer 5, which, here, for example, is created as an oxide layer produced over the entire surface and, in the case of a semiconductor support 2 made of silicon, is consequently a $SiO_2$ layer. Applied on the insulating layer 5 by masking or etching, for example, is additionally another structured metal layer, such as, for example, a layer consisting of Cu or Al. By use of said metal layer, a plurality of semiconductor components 8 are contacted via corresponding connecting layers 7, such as, for example, soldered layers or sintered layers. Said semiconductor components 8 involve, for example, IGBTs or diode bare dies. By way of another connecting layer 9, in turn, such as, for example, a soldered or sintered layer, corresponding connecting conductors 10, which can be copper or silver film, are contacted with the semiconductor components 8, said connecting conductors 10 being directed as a function of a predetermined circuitry. Thus, for example, the connecting conductor 10 shown on the left is connected to the metal layer 6 shown on the right.

Finally, the corresponding terminals 11 are provided on the metal layer 6 and can be used to wire the power module 1 correspondingly.

As can be seen, the construction of the power module 1 according to the invention is relatively simple, in particular because a separate DCB substrate, which serves as a support for the semiconductor elements and on which, in addition, a cooling element is to be arranged, does not need to be produced. Instead, as described, the support 2, made of semiconductor material, serves here, on the one hand, as a substrate for creating the actual wiring or the components, respectively, and, on the other hand, at the same time, as a cooling element.

Figure 2:
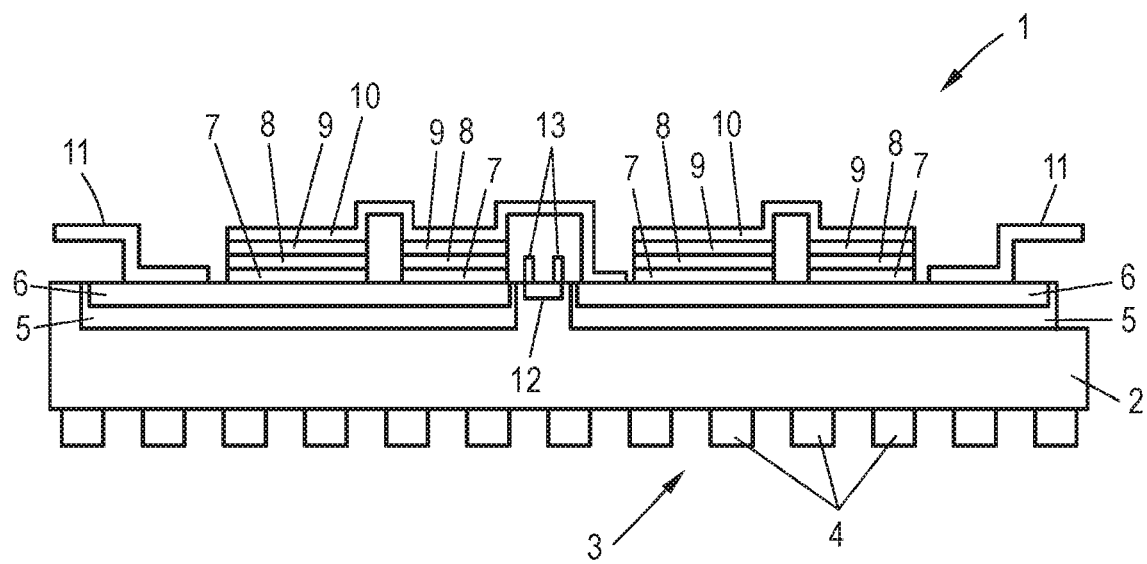

FIG. 2 shows another embodiment of an electronic power module 1 according to the invention, wherein identical reference numbers are used for identical components.

Provided here, in turn, is the support 2, which, at the same time, is also a cooling element, and is furnished on the back side with a surface structuring 3 composed of crosspieces 4 or ribs.

Provided, in turn, is an insulating layer 5, wherein, however, said insulating layer is structured in this case; that is, it is therefore not deposited over a large area or over the entire area, but rather is produced only locally. If the semiconductor material of the support 2 is made of silicon, then the insulating layer 5 is made of $SiO_2$.

Each of the separate insulating layers 5, in turn, is coated with a metal layer 6, on which, via corresponding connecting layers 7, the semiconductor components 8 are, in turn, arranged or contacted. By way of additional connecting layers 9, the corresponding connecting conductors 10 are contacted with the semiconductor components 8 or with the metal layers 6, etc. Also provided are corresponding terminals 11 for the wiring of the power module 1.

As FIG. 2 shows, in the region between the two insulating layers 5, another electronic component 12, such as, for example, an integrated pn transition for a temperature or current measurement, for example, is created. Said pn transition can be produced through corresponding doping. Formed on it are corresponding terminals 13 in order to be able to wire it correspondingly. This means that said additional electronic component is created or produced directly in the semiconductor support 2.

Figure 3:
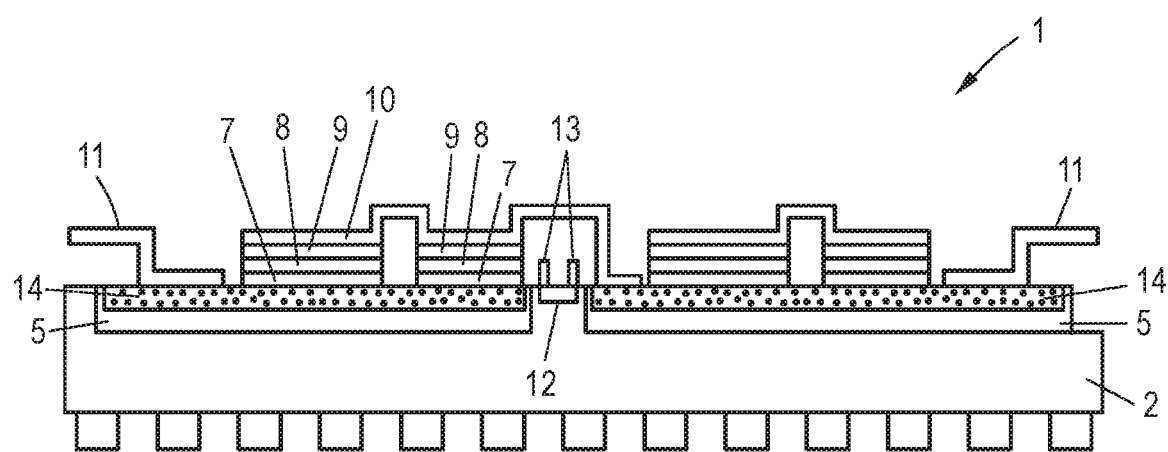

Finally, FIG. 3 shows an electronic power module 1 according to the invention, the construction of which corresponds to that of FIG. 2. Besides the support 2, which functions as a cooling element, two separate, locally or structured insulating layers 5 are provided here. However, said insulating layers are furnished with a structure 14 that is made conductive by doping or such a structure 14 is created on them. Therefore, in contrast to the embodiment according to FIG. 2, no separate metal layer or metallization consisting of Cu or Al is provided, but rather a conductivity on the insulating layers 5 is achieved solely by doping.

Said conductive structures 14 serve, in turn, for the mounting or contacting of the corresponding semiconductor components 8 via the connecting layers 7 and also for the contacting of the connecting conductors 10 or of the terminals 11.

Also provided here, by way of example, is an electronic component 12 formed at the support 2 itself by doping, as already described for the embodiment in accordance with FIG. 2. Said electronic component can be, as described, a temperature sensor, but also a current sensor, a diode, or the like.

The invention claimed is:

1. An electronic power module, comprising:
   at least one semiconductor component, which is arranged on a support which is in thermal contact with the semiconductor component as a cooling element, wherein the support comprises a semiconductor material and, at the same time, serves as the cooling element, the support further comprising at least one conductive structure that is formed on the support itself by doping and is contacted with the at least one semiconductor component,
   wherein at least one insulating layer which is an oxide layer is applied onto the support, and the at least one conductive structure with which the at least one semiconductor component is contacted is applied onto the at least one insulating layer,
   wherein the at least one insulating layer is a $SiO_2$ layer which is produced directly on the support,
   wherein the at least one insulating layer is applied onto a predetermined area of the support by a local depositing,
   wherein at least one additional electronic component is formed, by doping, directly on the support other than the predetermined area of the support,
   wherein the at least one additional electronic component includes a temperature sensor to measure a temperature of the support,
   wherein the predetermined area of the support for the at least one insulating layer includes a first region and a second region, and the at least one additional electronic component is provided between the first region and the second region,
   wherein the at least one insulating layer is provided onto an upper surface of the support, projecting ribs are provided onto a bottom surface of the support for the cooling element, and no conductive structure is provided in the support between the at least one insulating layer and the projecting ribs.

2. The electronic power module according to claim 1, wherein the semiconductor material is silicon.

3. The electronic power module according to claim 1, wherein a plurality of semiconductor components is contacted with the at least one conductive structure.

4. The electronic power module according to claim 1, wherein the support is structured on the surface of the back side to form a cooling structure.

5. The electronic power module according to claim 4, wherein the cooling structure is produced in the form of crosspieces or ribs.

6. The electronic power module according to claim 1, wherein the at least one semiconductor component and at least one terminal are separately contacted with the at least one conductive structure.

7. The electronic power module according to claim 1, wherein the at least one additional electronic component further includes a current sensor to measure a current of the support, and the current sensor is formed, by doping, directly on the support.

* * * * *